United States Patent
Chang et al.

(10) Patent No.: US 8,307,311 B2
(45) Date of Patent: Nov. 6, 2012

(54) SYSTEM AND METHOD FOR ASSISTING CIRCUIT DESIGN

(75) Inventors: Ting-Lin Chang, Daxi Township (TW); Ching-Feng Hsieh, Taipei (TW)

(73) Assignee: Askey Computer Corporation, Taipei (TW)

( * ) Notice: Subject to any disclaimer, the term of this patent is extended or adjusted under 35 U.S.C. 154(b) by 489 days.

(21) Appl. No.: 12/550,530

(22) Filed: Aug. 31, 2009

(65) Prior Publication Data
US 2010/0318948 A1 Dec. 16, 2010

(30) Foreign Application Priority Data
Jun. 5, 2009 (TW) ................................ 98118676 A

(51) Int. Cl.
*G06F 17/50* (2006.01)
(52) U.S. Cl. ......... 716/100; 716/102; 716/110; 716/119
(58) Field of Classification Search .......... 716/100–107, 716/110, 119
See application file for complete search history.

(56) References Cited

U.S. PATENT DOCUMENTS

| | | | | |
|---|---|---|---|---|
| 5,384,710 A | * | 1/1995 | Lam et al. ..................... | 716/102 |
| 7,418,683 B1 | * | 8/2008 | Sonnard et al. ............... | 716/122 |
| 2002/0006695 A1 | * | 1/2002 | Hatsch et al. ................. | 438/200 |
| 2003/0233623 A1 | * | 12/2003 | Bertram et al. ................. | 716/2 |
| 2004/0243373 A1 | * | 12/2004 | Sercu et al. ..................... | 703/14 |
| 2008/0104557 A1 | * | 5/2008 | Gopalakrishnan et al. ....... | 716/5 |

FOREIGN PATENT DOCUMENTS
CN 1421806 6/2003
* cited by examiner

*Primary Examiner* — Paul Dinh
(74) *Attorney, Agent, or Firm* — Peter F. Corless; Steven M. Jensen; Edwards Wildman Palmer LLP

(57) ABSTRACT

A system and method for assisting printed circuit board design are characterized by a circuit pre-configuration interface capable of synchronously performing circuit design and performing pre-configuration layout of electronic parts in the circuitry to thereby solve a known problem, wherein engineers spend considerable time arranging electronic parts at a late stage due to layout engineers' unfamiliarity with a circuit's characteristics. The circuit pre-configuration interface also directly adjusts and modifies electronic parts in the finalized circuitry, thereby providing a data exchange platform for the circuit design software and circuit layout software to increase the circuit layout efficiency.

5 Claims, 2 Drawing Sheets

SYSTEM AND METHOD FOR ASSISTING CIRCUIT DESIGN

BACKGROUND OF THE INVENTION

1. Field of the Invention

This invention relates to electronic design automation (EDA) techniques, and more particularly, to a system and method for assisting circuit design to generate circuit layouts via the electronic design automation technique.

2. Description of Related Art

In the electronic equipment manufacturing industry, printed circuit board (PCB) design is becoming increasingly more sophisticated. Printed circuit board design is divided into two principle stages: a circuit design stage and a circuit layout stage. In the circuit design stage, an electronic designer uses circuit design or capture software (e.g., Protel) to set the attributes of the circuit, the circuit design software generating a corresponding output file as a result. Then, a circuit layout software package (e.g., Mentor Graphics or OrCad) reads the output file, and a final circuit map is generated in the circuit layout stage.

The above prior art, though using a professional software package to assist the completion of the layout operation, has the following drawbacks.

Two different groups of electronic engineers perform the circuit design work and the circuit layout work. Hence, a circuit layout engineer unfamiliar with the characteristics of the electronic parts is likely to spend much time arranging the electronic parts.

In addition, after the circuit layout engineer has designed a circuit layout, the circuit design engineer, if unsatisfied with the position of the electronic parts in the circuit layout, cannot amend the circuit layout directly.

SUMMARY OF THE INVENTION

In view of the above-mentioned problems of the prior art, the present invention provides a system for assisting circuit design. The system is connected to a parts database and includes: an input module for introducing a circuit design schematic generated by circuit design software; a compiling module for providing a circuit pre-configuration interface, and selecting electronic parts required for a layout operation from the parts database according to the circuit design schematic introduced by the input module and configuring the circuit design schematic into a corresponding pre-circuit-layout; and a transformation module for transforming the pre-circuit-layout compiled and generated by the compiling module into a file format identifiable by the circuit layout software and outputting the pre-circuit-layout to the circuit layout software, for the execution of subsequent layout operations.

In an embodiment of the present invention, the transformation module further comprises introducing a circuit layout generated by the circuit layout software, and amending and compiling electronic parts in the circuit layout via the circuit pre-configuration interface provided by the compiling module, and the system is a plug-in module embedded in the circuit design software.

The present invention further provides a method for assisting circuit design. The method is connected to a parts database and includes: introducing a circuit design schematic generated by circuit design software; providing a circuit pre-configuration interface, and selecting electronic parts required for a pre-layout operation from the parts database according to the introduced circuit design schematic and configuring the circuit design schematic into a corresponding pre-circuit-layout; and transforming the compiled and generated pre-circuit-layout into a file format identifiable by the circuit layout software, and outputting the pre-circuit-layout to the circuit layout software, for the execution of subsequent layout operations.

In an embodiment of the present invention, the method further comprises amending and compiling the electronic parts in the circuit layout via the provided circuit pre-configuration interface.

Compared with the prior art, the system and method for assisting circuit design according to the present invention provide a data exchange platform for the circuit design software and the circuit layout software. Accordingly, the circuit pre-configuration interface can design a circuit map, perform a pre-layout design for corresponding electronic parts in the circuit map, and, at a late stage, adjust and amend the positions where the electronic parts in the circuit are laid out. Therefore, a drawback of the prior art, namely, engineers' spending considerable time arranging electronic parts at a late stage due to the engineers' unfamiliarity with circuitry characteristics, is overcome, and the circuit layout efficiency of disposition of the electronic parts is improved.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, wherein these and other advantages and effects can be readily understood by those skilled in the art after reading this specification. The present invention can also be implemented or applied by other embodiments. The details of the specification may vary depending on the application, and numerous modifications and variations can be devised without departing from the spirit of the present invention.

Figure 1:
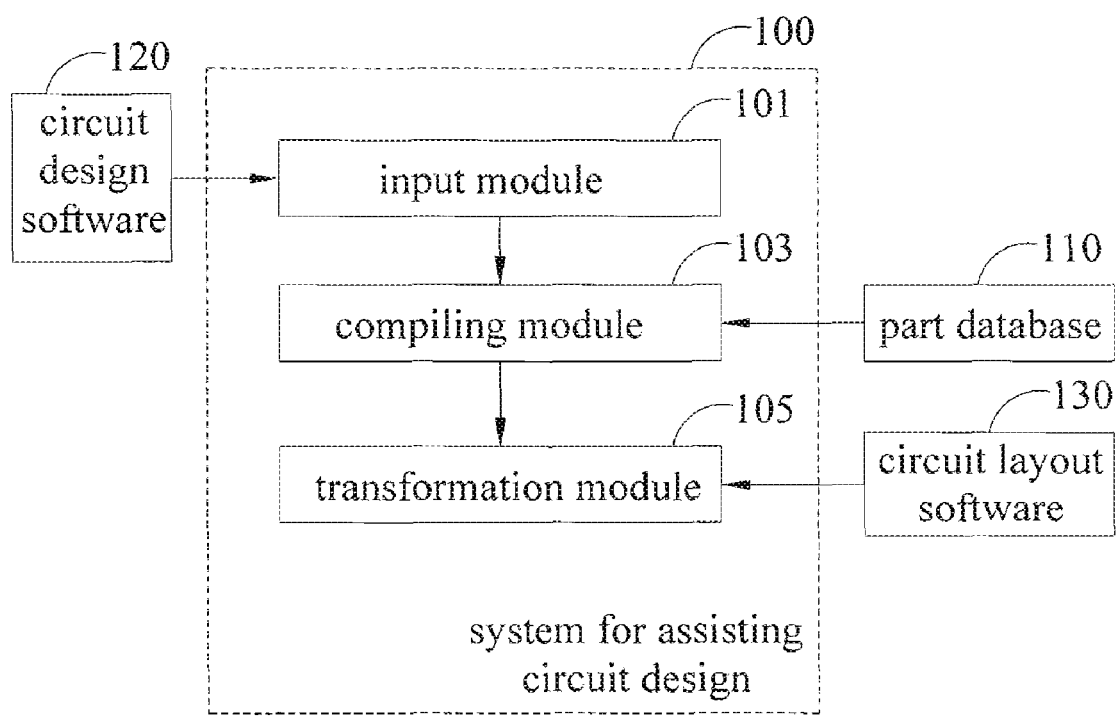
FIG. 1 is a functional block diagram of a system for assisting circuit design according to the present invention.

Please refer to FIG. 1, which is a functional block diagram of a system 100 (enclosed by a dashed-line in the drawing) for assisting circuit design according to the present invention.

The system 100 is connected to a parts database 110, and provides data exchange platform for circuit design software 120 and circuit layout software 130 of the prior art. In an embodiment of the present invention, the circuit design software (or circuit design program) 120 is, but is not limited to, Protel PCB design software or Allegro design software, and the circuit layout software 130 is Mentor Graphics design software or OrCad design software.

In an embodiment of the present invention, the system 100 is a plug-in software module embedded in the circuit design software 120. With the system 100, a circuit designer, when designing a circuit, is allowed to determine positions where electronic parts in a circuit design schematic are to be disposed, and display the electronic parts concurrently. The circuit pre-layer data are further output to the circuit layout software 130, for the execution of subsequent corresponding layout operations. Therefore, the cost incurred in spending additional time on the layout of the electronic parts at a late stage by layout personnel unfamiliar with the characteristics of the electronic parts is greatly reduced. Moreover, the system 100 according to the present invention allows front-end circuit designers to adjust and amend the electronic parts in the circuit layout via the circuit layout designed and generated by the circuit layout software 130.

The system 100 for assisting circuit design according to the present invention comprises an input module 101, a compiling module 103 and a transformation module 105.

The input module 101 receives a circuit design schematic designed on and generated by the circuit design software 120.

The compiling module 103 provides a circuit pre-configuration interface, allowing a circuit designer to select electronic parts required for a pre-layout operation from the parts database 110 according to the circuit design schematic introduced by the input module 101, and configures the circuit design schematic into a corresponding pre-circuit-layout. In practice, the present invention allows the circuit designer, when designing a circuit, to determine positions where the electronic parts are to be disposed via the circuit pre-configuration interface concurrently provided by the compiling module 103, thereby configuring the circuit design schematic into the corresponding pre-circuit-layout.

The circuit pre-configuration interface provided by the compiling module 103 further allows the circuit designer to amend and compile the positions where the electronic parts of the pre-circuit-layout are disposed, or amend and compile the positions of the electronic parts of the circuit layout during a late stage of the process.

The transformation module 105 transforms the pre-circuit-layout compiled and generated by the compiling module 103 into a file format identifiable by the circuit layout software 130, and outputs the pre-circuit-layout to the circuit layout software 130. Accordingly, the circuit designer is allowed to execute subsequent layout operations in the pre-circuit-layout directly to generate the final circuit layout. Therefore, the drawback of the prior art of engineers spending much time arranging electronic parts at a late stage due to other engineers' unfamiliarity with circuitry characteristics is overcome, and the circuit layout efficiency of disposition of the electronic parts is improved.

In an embodiment of the present invention, the transformation module 105 further receives the circuit layout generated by the circuit layout software 130, and allows a circuit designer to amend and compile the positions where the electronic parts of the circuit layout are disposed via the circuit pre-configuration interface provided by the compiling module 103. In other words, the transformation module 105 acts as a data exchange platform between the circuit design software 120 and the circuit layout software 130 so as to process a bi-directional data stream therebetween.

Figure 2:
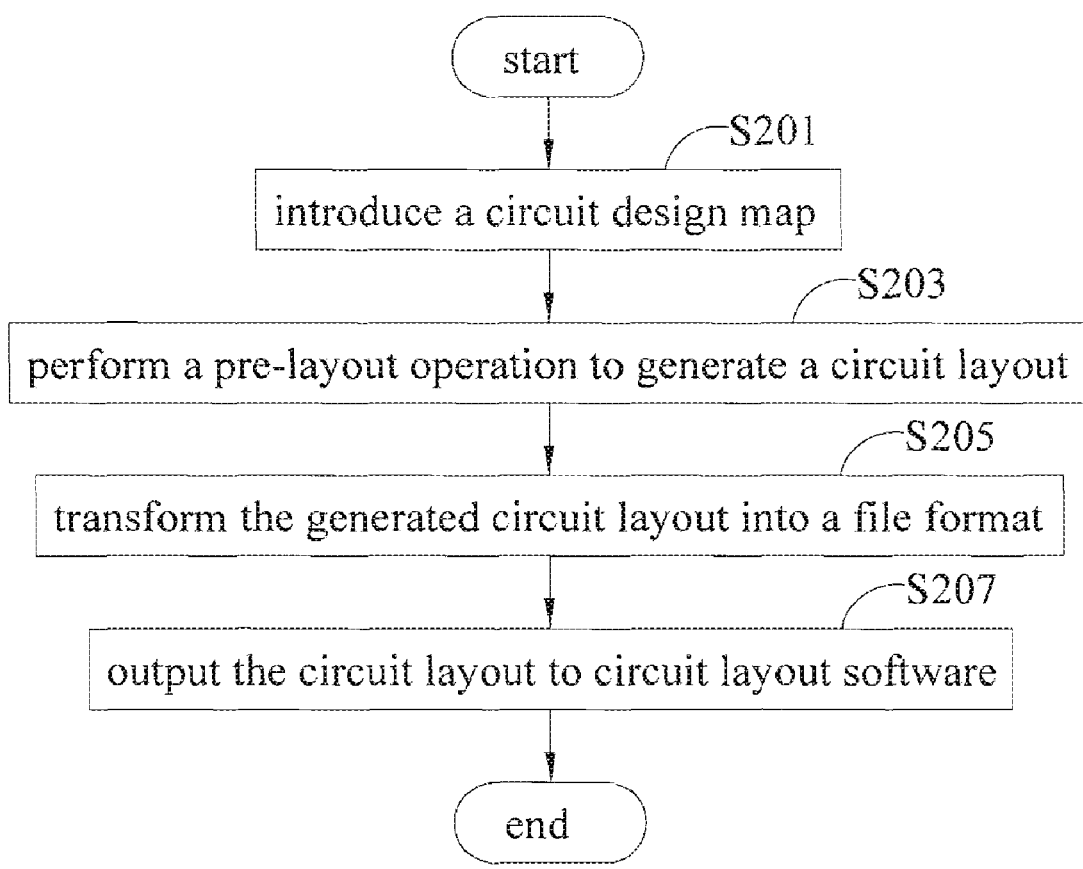
FIG. 2 is a flow chart of a method for assisting circuit design according to the present invention.

FIG. 2 is a flow chart of a method for assisting circuit design according to the present invention. In step S201, the circuit design schematic designed and generated by the circuit design software 120 is introduced into (received by) the system 100. In an embodiment of the present invention, the system 100 is a plug-in program embedded in the circuit design software 120. Next, proceed to step S203.

In step S203, a circuit pre-configuration interface is provided, allowing a circuit designer, when designing a circuit, to select electronic parts required for a circuit layout operation from the parts database 110 via the circuit pre-configuration interface, and concurrently determine the positions where the electronic parts are disposed, so as to generate a pre-circuit-layout, for the reference and subsequent layout operations performed by circuit layout engineers. Next, proceed to step S205.

In step S205, the generated pre-circuit-layout is transformed into a file format identifiable by the circuit layout software 130. Then, proceed to step S207.

In step S207, the pre-circuit-layout is output to the circuit layout software 130, for a circuit designer to execute subsequent layout operations.

In an embodiment of the present invention, the method for assisting circuit design further comprises receiving the circuit layout generated by the circuit layout software 130, and allowing a circuit designer to amend and compile the layout of the electronic parts of the circuit layout via the circuit pre-configuration interface provided in step S203 of the method.

In summary, the system and method for assisting circuit design according to the present invention allow a circuit designer, when designing a circuit, to concurrently determine the positions where electronic parts are disposed via a circuit pre-configuration interface, to generate a corresponding pre-circuit-layout, for the reference and use of circuit layout engineers in subsequent layout operations. Therefore, a drawback of the prior art, namely, engineers spending considerable time arranging electronic parts at a late stage due to the engineers' unfamiliarity with circuitry characteristics, is overcome, and the circuit layout efficiency of disposition of the electronic parts is improved.

The foregoing descriptions of the detailed embodiments are illustrated to disclose the features and functions of the present invention and are not intended to be restrictive of the scope of the present invention. It should be understood by those skilled in the art that many modifications and variations can be made to the embodiments according to the spirit and principles in the disclosure of the present invention and yet still fall within the scope of the invention as set forth in the appended claims.

What is claimed is:

1. A non-transitory computer-readable storage medium which stores instructions and is applicable to a system for assisting circuit design, the system being connected to a parts database and comprising an input module, a compiling module, and a transformation module, the instructions, when executed by a computer, enabling:

the input module to introduce a circuit design schematic generated by circuit design software;

the compiling module to provide a circuit pre-configuration interface that allows a user to select electronic parts from the parts database required for a layout operation according to the circuit design schematic introduced by the input module, and to configure the circuit design schematic into a corresponding pre-circuit-layout; and the transformation module to transform the pre-circuit-layout compiled and generated by the compiling module into a file format identifiable by circuit layout software and outputting the pre-circuit-layout to the circuit layout software, for execution of subsequent layout operations, wherein the instructions further enable the transformation module to receive a circuit layout generated by the circuit layout software, and amend and compile the electronic parts in the circuit layout via the circuit pre-configuration interface provided by the compiling module, and enable the transformation module to amend and compile positions where the electronic parts in the circuit layout are disposed via the circuit pre-configuration interface provided by the compiling module.

2. The non-transitory computer-readable storage medium of claim 1, wherein the circuit pre-configuration interface further amends and compiles positions where the electronic parts in the pre-circuit-layout are disposed.

3. The non-transitory computer-readable storage medium of claim 1, wherein the system is a plug-in software module embedded in the circuit design software.

4. A method for assisting circuit design, by using a computer, comprising the steps of:
 introducing, by using the computer, a circuit design schematic generated by circuit design software;
 providing a circuit pre-configuration interface to allow a user to select electronic parts required for a pre-layout operation from a parts database according to the introduced circuit design schematic, and configuring the circuit design schematic into a corresponding pre-circuit-layout;
 transforming the pre-circuit-layout into a file format identifiable by circuit layout software, and outputting the pre-circuit-layout to the circuit layout software, for execution of subsequent layout operations; and
 introducing a circuit layout generated by the circuit layout software, and amending and compiling the electronic parts in the circuit layout via the circuit pre-configuration interface,
 wherein amending and compiling the electronic parts in the circuit layout via the circuit pre-configuration interface comprises amending and compiling positions where the electronic parts in the circuit layout are disposed via the circuit pre-configuration interface.

5. The method of claim 4, further comprising amending and compiling, by using the computer, the positions of the electronic parts in the pre-circuit layout via the circuit pre-configuration interface.

* * * * *